United States Patent
Ho (10) Patent No.: US 12,027,216 B2
(45) Date of Patent: Jul. 2, 2024

(54) MEMORY AND READING METHOD OF THE MEMORY FOR COMPENSATING LEAKAGE CURRENT

(71) Applicant: Winbond Electronics Corp., Taichung (TW)

(72) Inventor: Wen-Chiao Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 227 days.

(21) Appl. No.: 17/693,411

(22) Filed: Mar. 14, 2022

(65) Prior Publication Data

US 2023/0290416 A1 Sep. 14, 2023

(51) Int. Cl.
*G11C 16/28* (2006.01)

(52) U.S. Cl.
CPC .................. *G11C 16/28* (2013.01)

(58) Field of Classification Search
CPC ....................................... G11C 16/28
USPC ..................................... 365/185.13
See application file for complete search history.

(56) References Cited

U.S. PATENT DOCUMENTS

| 7,245,526 B2 | 7/2007 | Oh et al. |
| 9,406,353 B2 | 8/2016 | Vimercati |
| 2019/0378567 A1* | 12/2019 | Gangasani ......... G11C 13/0004 |
| 2020/0105345 A1* | 4/2020 | Baek ...................... G11C 7/04 |
| 2022/0208279 A1* | 6/2022 | Vijayvergia ........... G11C 16/24 |

FOREIGN PATENT DOCUMENTS

TW    I718695    2/2021

* cited by examiner

*Primary Examiner* — Connie C Yoha
(74) *Attorney, Agent, or Firm* — JCIPRNET (57) ABSTRACT

A memory, including a selected memory cell block and a first sense amplifying device, is provided. The selected memory cell block and the first sense amplifying device are both coupled to a first global bit line. The first sense amplifying device is configured to: in a leakage current detection mode, detect a leakage current of the selected memory cell block on a first global bit line to generate leakage current information; and in a data reading mode, provide a reference signal according to the leakage current information, and compare a readout signal on the first global bit line with the reference signal to generate readout data, wherein the leakage current detection mode happens before the data reading mode.

16 Claims, 7 Drawing Sheets

MEMORY AND READING METHOD OF THE MEMORY FOR COMPENSATING LEAKAGE CURRENT

BACKGROUND

Technical Field

The disclosure relates to a memory and a reading method of the memory, and particularly relates to a memory and a reading method of the memory that can compensate for leakage current.

Description of Related Art

Figure 1:
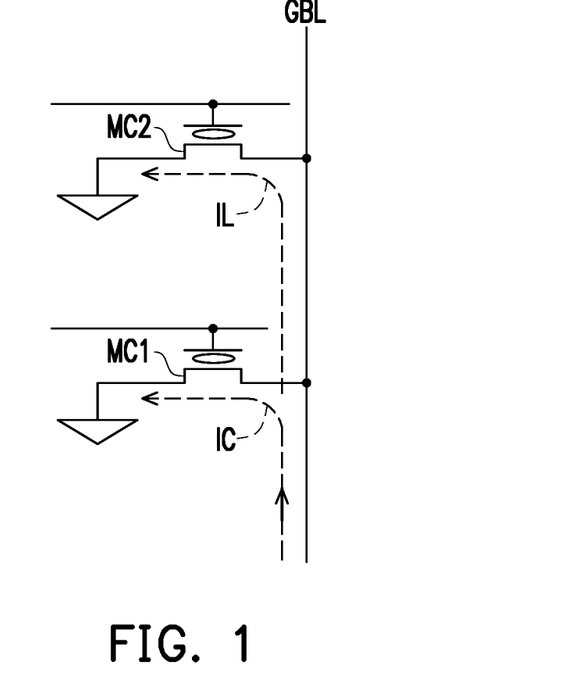
FIG. 1 is a schematic diagram of a conventional memory reading operation.

In a flash memory, an erasing operation of a memory cell may be suspended due to various reasons, thereby causing the phenomenon of an incomplete erasing operation. Such phenomenon may cause the phenomenon of leakage current in an unselected memory cell when the memory is performing a reading operation, as shown in FIG. 1, which is a schematic diagram of a conventional memory reading operation. A memory cell MC2 is a memory cell that has not completed the erasing operation. When a memory 100 executes a reading operation for a global bit line GBL, and a memory cell MC1 is the selected memory cell and the memory cell MC2 is the unselected memory cell, the memory cells MC1 and MC2 respectively provide a readout current IC and a leakage current IL. In this way, there may be an error in a sensing operation of readout data for the total current value on the global bit line GBL due to the interference of the leakage current IL, resulting in inaccurate readout data.

SUMMARY

The disclosure provides a memory, which includes a selected memory cell block and a first sense amplifying device. Both the selected memory cell block and the first sense amplifying device are coupled to a first global bit line. The first sense amplifying device is configured to detect a leakage current of the selected memory cell block on the first global bit line to generate leakage current information in a leakage current detection mode; and provide a reference signal according to the leakage current information, and compare a readout signal on the first global bit line with the reference signal to generate readout data in a data reading mode. The leakage current detection mode happens before the data reading mode.

A reading method of a memory of the disclosure includes the following steps. A first sense amplifying device is provided to couple to a first global bit line. In a leakage current detection mode, the first sense amplifying device detects a leakage current of a selected memory cell block on the first global bit line to generate leakage current information. In a data reading mode, the first sense amplifying device provides a reference signal according to the leakage current information, and compares a readout signal on the first global bit line with the reference signal to generate readout data. The leakage current detection mode happens before the data reading mode.

Based on the above, before the memory of the disclosure performs the reading operation, the leakage current detection operation may be first executed on the global bit line to obtain the leakage current information. In addition, in the data reading operation, compensation is performed according to the leakage current information, so as to obtain the accurate readout data.

DETAILED DESCRIPTION OF DISCLOSED EMBODIMENTS

Figure 2:
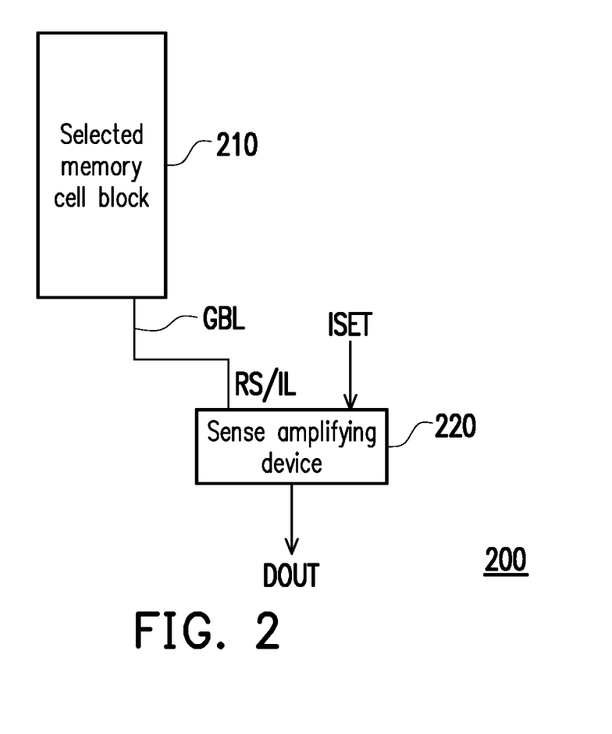
FIG. 2 is a schematic diagram of a memory according to an embodiment of the disclosure.

Please refer to FIG. 2, which is a schematic diagram of a memory according to an embodiment of the disclosure. A memory 200 includes a selected memory cell block 210 and a sense amplifying device 220. The selected memory cell block 210 has multiple memory cells and is commonly coupled to a global bit line GBL. The sense amplifying device 220 is coupled to the selected memory cell block 210 through the global bit line GBL. In the embodiment, when one or more memory cells in the selected memory cell block 210 are selected to execute a reading operation, the sense amplifying device 220 may detect a leakage current of the selected memory cell block 210 on the global bit line GBL to generate leakage current information in a leakage current detection mode. Next, the sense amplifying device 220 may provide a reference signal according to the leakage current information, and compare a readout signal RS on the global bit line GBL with the reference signal to generate readout data DOUT in a data reading mode.

In the embodiment, the leakage current detection mode may happen before the data reading mode. Moreover, in the leakage current detection mode, multiple word line signals received by multiple memory cells corresponding to the global bit line GBL are all disabled. In other words, in the leakage current detection mode, the memory cells in the selected memory cell block 210 are all non-accessible. At this time, the sense amplifying device 220 may receive the leakage current IL generated on the global bit line GBL, so as to generate the leakage current information.

Further, the sense amplifying device 220 may receive a setting signal ISET, and adjust the setting signal ISET according to a setting ratio to generate a leakage current replica signal. The sense amplifying device 220 compares the leakage current replica signal with the leakage current IL on the global bit line GBL to generate a comparison result. If an initial value of the comparison result is a first logic level, the sense amplifying device 220 may perform an adjusting operation on the setting ratio when the comparison result is maintained at the first logic level, and perform the next comparing operation of the leakage current replica signal and the leakage current IL. Once the comparison result changes from the first logic level to a second logic level, the sense amplifying device 220 can record the current leakage current replica signal to generate leakage current information.

Also, in other embodiments, the sense amplifying device 220 may also record the current setting ratio to generate the leakage current information.

In the embodiment, the setting signal ISET may be preset as a signal with a relatively high value. Under such condition, the sense amplifying device 220 may progressively decrease the setting ratio to perform the comparing operation of the leakage current replica signal and the leakage current IL. In an initial stage, the leakage current replica signal may be greater than the leakage current IL, so that the comparison result is at the first logic level. As the setting ratio is decreased, the leakage current replica signal may be adjusted to be less than or equal to the leakage current IL, and the sense amplifying device 220 may generate the comparison result at the second logic level. The leakage current replica signal at this time is in a state closest to the leakage current IL.

Alternatively, the setting signal ISET may also be preset as a signal with a relatively low value. Under such condition, the sense amplifying device 220 may progressively increase the setting ratio to perform the comparing operation of the leakage current replica signal and the leakage current IL. In an initial stage, the leakage current replica signal may be less than the leakage current IL, so that the comparison result is at the first logic level. As the setting ratio is increased, the leakage current replica signal may be adjusted to be greater than or equal to the leakage current IL, and the sense amplifying device 220 may generate the comparison result at the second logic level. The leakage current replica signal at this time may also be in the state closest to the leakage current IL.

In addition, the first logic level may be logic 1 or logic 0, and the second logic level may be logic 0 or 1 complementary to the first logic level, and there is no fixed limitation.

After the leakage current detection mode is completed, the memory 100 may enter the data reading mode. In the data reading mode, a selected word line in the selected memory cell block 210 may be enabled, and the remaining at least one unselected word line is disabled. At this time, selected memory cells in the selected memory cell block 210 may provide a readout signal RS on the global bit line GBL.

On the other hand, in the data reading mode, the sense amplifying device 220 may generate the reference signal according to the leakage current information. In addition, the sense amplifying device 220 may compare the readout signal RS with the reference signal and generate the readout data DOUT. It can be known from the above description that the reference signal generated by the sense amplifying device 220 according to the embodiment of the disclosure is generated after compensation according to the leakage current information. Therefore, the readout data DOUT generated by the sense amplifying device 220 may be protected from the interference of the leakage current generated by the memory cells in the selected memory cell block 210, which effectively improves the accuracy of the readout data DOUT.

Figure 3:
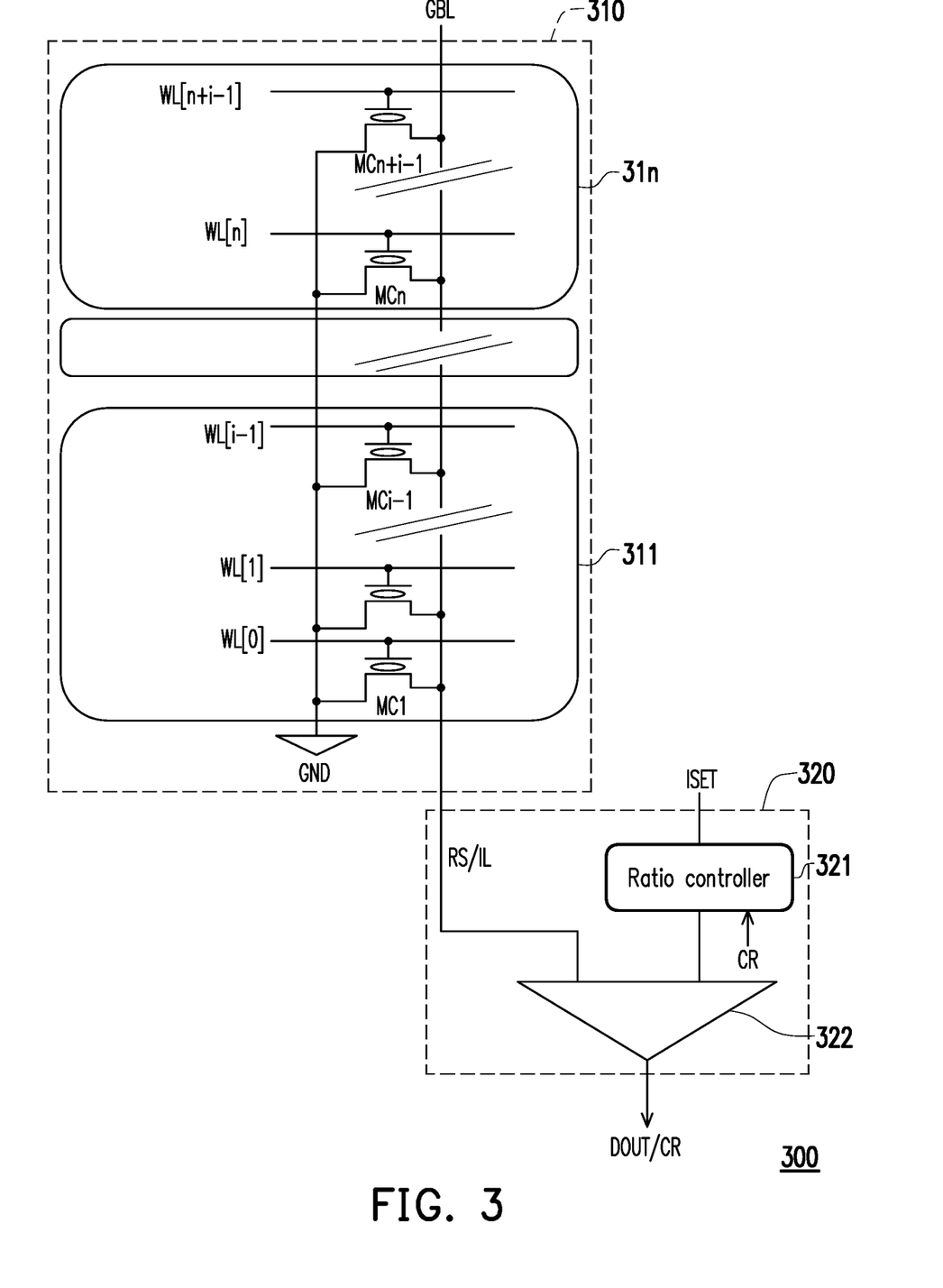
FIG. 3 is a schematic diagram of an implementation of a memory according to another embodiment of the disclosure.

Please refer to FIG. 3 below. FIG. 3 is a schematic diagram of an implementation of a memory according to another embodiment of the disclosure. A memory 300 includes a selected memory cell block 310 and a sense amplifying device 320. The selected memory cell block 310 may be divided into multiple sectors 311 to 31n. The sectors 311 to 31n of the selected memory cell block 310 share the same global bit line GBL. The selected memory cell block 310 has multiple memory cells MC1 to MCn+i−1. The memory cells MC1 to MCn+i−1 are respectively coupled to word lines WL[0] to WL[n+i−1]. Source terminals of the memory cells MC1 to MCn+i−1 are commonly coupled to a ground voltage GND.

The sense amplifying device 320 includes a ratio controller 321 and a sense amplifier 322. The sense amplifier 322 has a first input terminal coupled to the global bit line GBL, and the sense amplifier 322 has a second input terminal coupled to the ratio controller 321. The ratio controller 321 is configured to receive the setting signal ISET, and adjust the setting signal ISET according to the setting ratio to generate the leakage current replica signal. The ratio controller 321 may also adjust the setting ratio according to a comparison result CR generated by the sense amplifier 322.

In the leakage current detection mode, the word lines WL[0] to WL[n+i−1] are all disabled. The sense amplifying device 320 compares the leakage current replica signal provided by the ratio controller 321 with the leakage current IL on the global bit line GBL. The ratio controller 321 progressively adjusts the value of the setting ratio according to the comparison result CR generated by the sense amplifier 322, so as to obtain the leakage current information.

The implementation details of the manner of obtaining the leakage current information have been described in detail in the foregoing embodiment of FIG. 1 and will not be repeated.

On the other hand, in the data reading mode, a selected word line among the word lines WL[0] to WL[n+i−1] is enabled (the remaining unselected word lines are disabled). The selected memory cells may provide the readout signal RS to the global bit line GBL according to the stored data and the leakage current IL. At the same time, the sense amplifying device 320 may generate the reference signal according to the leakage current information obtained in the leakage current detection mode, and enable the sense amplifier 322 to compare the readout signal RS with the reference signal to generate the readout data DOUT.

Note here that since the reference signal is generated according to the leakage current information, when the sense amplifier 322 compares the readout signal RS with the reference signal, the part of the leakage current IL in the readout signal RS may be eliminated. In this way, the sense amplifier 322 may generate the accurate readout data DOUT.

Figure 4:
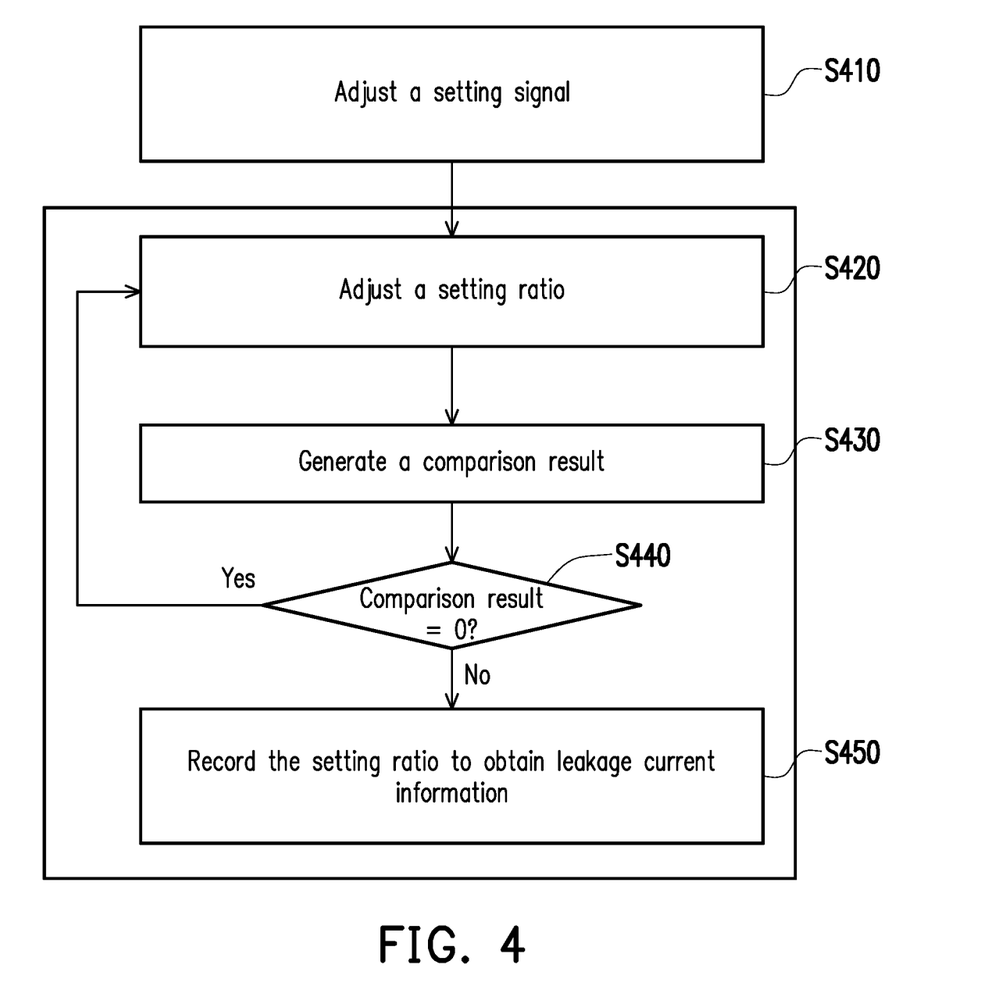
FIG. 4 is a flowchart of an operation of a memory obtaining leakage current information according to an embodiment of the disclosure.

Please refer to FIG. 4 below. FIG. 4 is a flowchart of an operation of a memory obtaining leakage current information according to an embodiment of the disclosure. In the leakage current detection mode, in Step S410, the value of the setting signal may be set through a trim mechanism of a test process during wafer testing. The setting signal may be set as a signal with a relatively large value. In the embodiment of the disclosure, the setting signal may be a current signal. The trim mechanism of the test process may be performed through a circuit breaker (or a non-circuit breaker) electronic fuse or by using a trim technology of a test process commonly known to persons skilled in the art, and there is no particular limitation.

In Step S420, the adjusting operation of the setting ratio is performed. In the embodiment, since the setting signal may be set as a signal with a relatively large value, the setting ratio may be a value equal to 1. By setting the signal and setting the value, the sense amplifying device of the embodiment may generate the leakage current replica signal to be compared with the leakage current on the global bit line, and generate the comparison result in Step S430.

In Step S440, whether the comparison result is equal to the initial value (for example, logic 0) is judged. If the judgment result is yes, Step S420 is re-executed to further decrease the setting ratio. If the judgment result is no, the setting ratio may be recorded to obtain the leakage current information (Step S450).

Also, Step S410 in the embodiment may also adjust a relatively small setting signal through the trim mechanism of the test process. In this way, in Step S420, the setting ratio may be adjusted to a value less than 1. And after the judgment result of Step S440 is yes, Step S420 may further increase the setting ratio.

Figure 5:
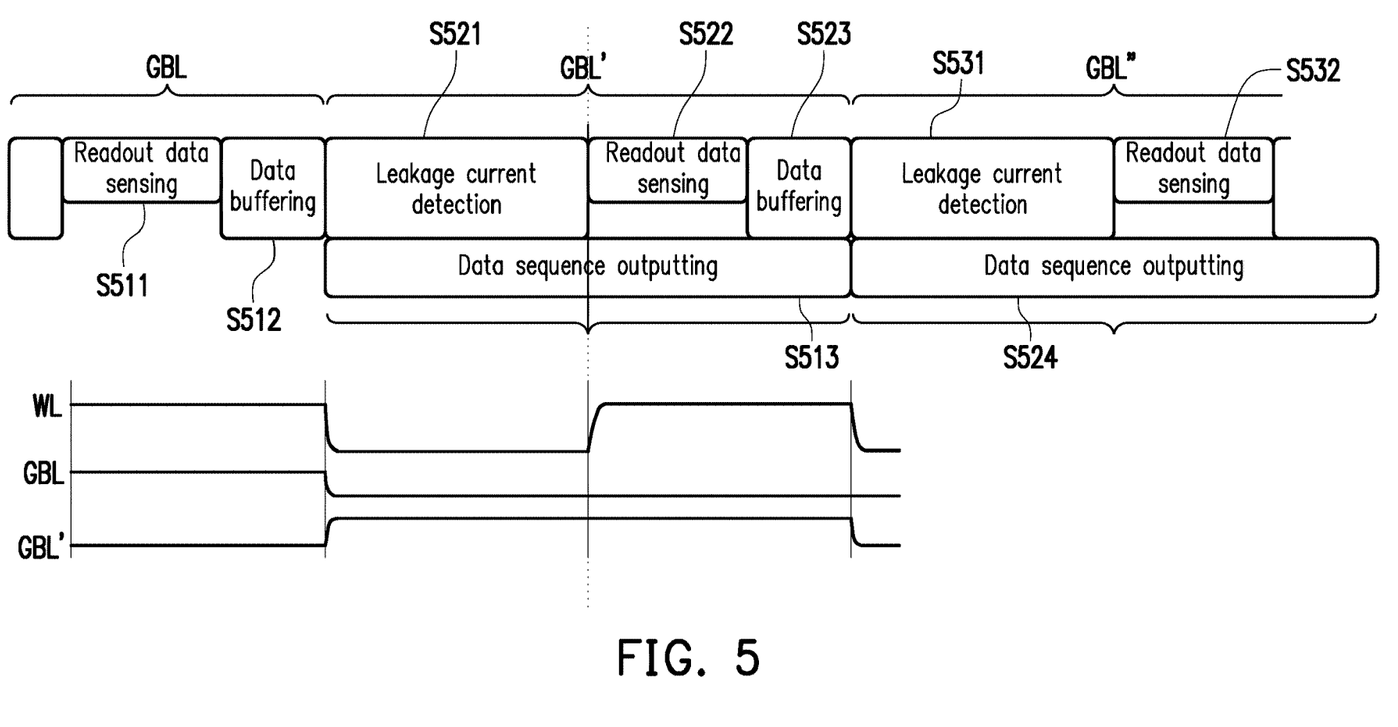
FIG. 5 is a timing diagram of a reading operation of a memory according to an embodiment of the disclosure.

Please refer to FIG. 5 below. FIG. 5 is a timing diagram of a reading operation of a memory according to an embodiment of the disclosure. First, corresponding to the global bit line GBL of a first selected memory cell block, steps such as readout data sensing S511 and data buffering S512 are sequentially executed. A corresponding word line signal WL may be enabled (pulled up to a high voltage), and a voltage value corresponding to the readout data is generated on the corresponding global bit line GBL. Then, corresponding to a global bit line GBL' of a second selected memory cell block, steps such as leakage current detection S521, readout data sensing S522, and data buffering S523 are sequentially executed. In the leakage current detection S521 step, the corresponding word line signal WL is disabled. In the readout data sensing S522 step, the voltage on the word line signal WL is pulled up and the word line signal WL is enabled. Correspondingly, the global bit line GBL does not operate and is at a low voltage, and the global bit line GBL' generates a voltage change corresponding to the leakage current detection S521 step and the readout data sensing S522 step.

It is worth mentioning that while the steps such as the leakage current detection S521, the data readout sensing S522, and the data buffering S523 are sequentially executed, data read from the first selected memory cell block may be sent out by a data sequence outputting S513 step. The data sequence outputting S513 step and the steps such as the leakage current detection S521, the readout data sensing S522, and the data buffering S523 may be synchronously executed. The total time required for the data sequence outputting S513 step is just enough to execute all the steps of the leakage current detection S521, the readout data sensing S522, and the data buffering S523. In other words, the leakage current detection S521 step does not require extra time to be executed, which effectively maintains the data reading rate of the memory.

Then, corresponding to a global bit line GBL" of a third selected memory cell block, the steps of the leakage current detection S531 and the readout data sensing S532 are sequentially executed. Also, the data sequence outputting S524 is synchronously executed to send out the readout data obtained from the second selected memory cell block. The reading operation of the third selected memory cell block is similar to the reading operation of the second selected memory cell block and will not be repeated.

It can be known from the embodiment that in the embodiment of the disclosure, through the operation of the leakage current detection mode, effective compensation may be performed for the phenomenon of leakage current without increasing the reading time of the memory, so as to ensure the accuracy of the readout data.

Figure 6A:
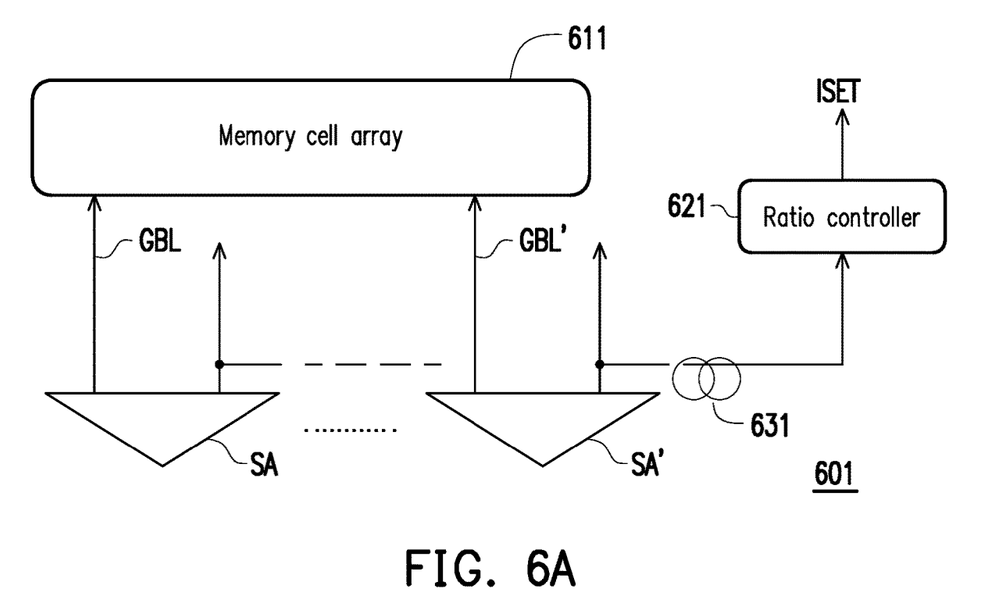
FIG. 6A and FIG. 6B are schematic diagrams of multiple implementations of a leakage current detection mode of a memory according to an embodiment of the disclosure.
Figure 6B:
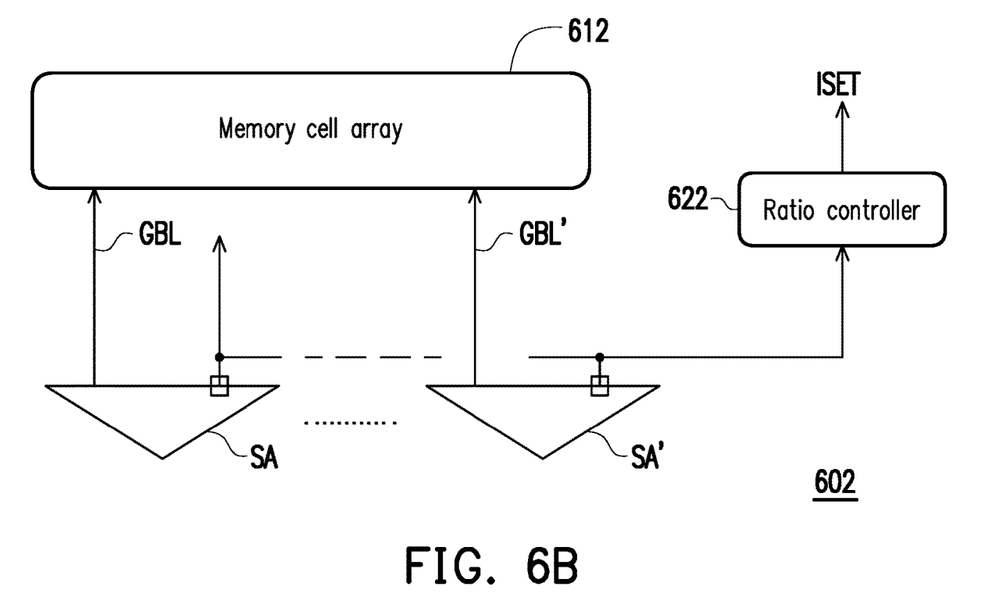

Please refer to FIG. 6A and FIG. 6B. FIG. 6A and FIG. 6B are schematic diagrams of multiple implementations of a leakage current detection mode of a memory according to an embodiment of the disclosure. In FIG. 6A, a memory 601 includes a memory cell array 611. The memory cell array 611 has multiple memory cell blocks, and multiple sense amplifiers SA to SA' are disposed corresponding to the memory cell blocks. The sense amplifiers SA to SA' are respectively coupled to the global bit lines GBL to GBL'. In the embodiment, a ratio controller 621 multiplies the setting ratio by the setting signal ISET to generate a leakage current replica signal. The leakage current replica signal is a current signal, and multiple mirrored leakage current replica signals may be respectively generated through a mirroring operation of a current mirror 631 to be sent to the sense amplifiers SA to SA'. In this way, through comparison results of the sense amplifiers SA to SA' in conjunction with the ratio controller 621 progressively adjusting the setting ratio, the leakage current information of the memory cell blocks corresponding to the global bit lines GBL to GBL' may be calculated one by one, which can quickly complete the leakage current detection operation.

In FIG. 6B, a memory 602 includes a memory cell array 612. The memory cell array 612 has multiple memory cell blocks, and multiple sense amplifiers SA to SA' are disposed corresponding to the memory cell blocks. The sense amplifiers SA to SA' are respectively coupled to the global bit lines GBL to GBL'. In the embodiment, a ratio controller 622 multiplies the setting ratio by the setting signal ISET to generate a leakage current replica signal. The leakage current replica signal may be a voltage signal to be sent to the sense amplifiers SA to SA' through a transmission wire. In this way, through comparison results of the sense amplifiers SA to SA' in conjunction with the ratio controller 622 progressively adjusting the setting ratio, the leakage current information of the memory cell blocks corresponding to the global bit lines GBL to GBL' may be calculated one by one, which can quickly complete the leakage current detection operation.

Figure 7A:
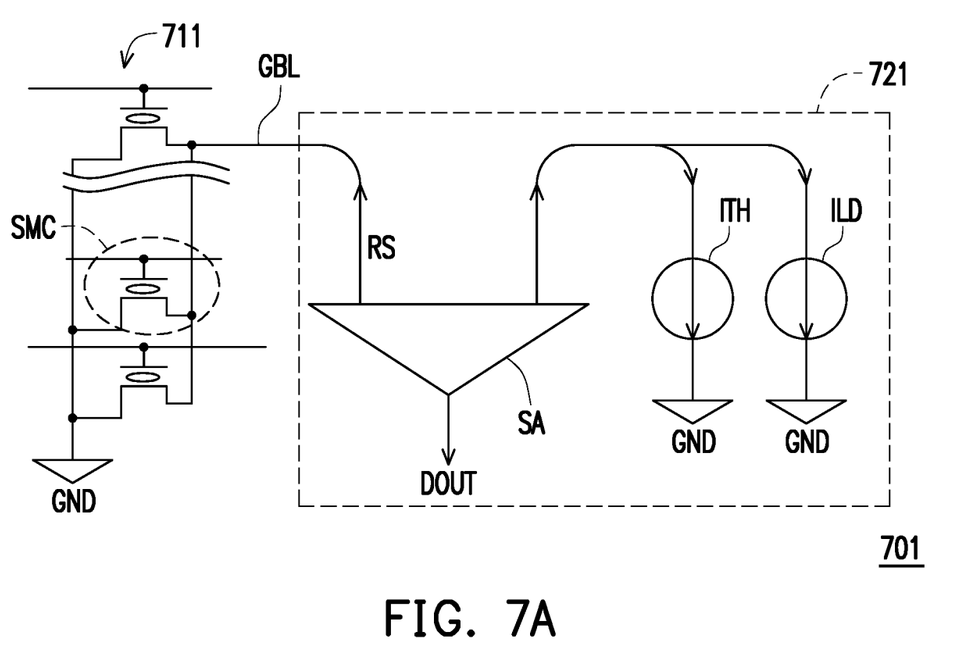
FIG. 7A and FIG. 7B are schematic diagrams of multiple implementations of a data reading mode of a memory according to an embodiment of the disclosure.
Figure 7B:
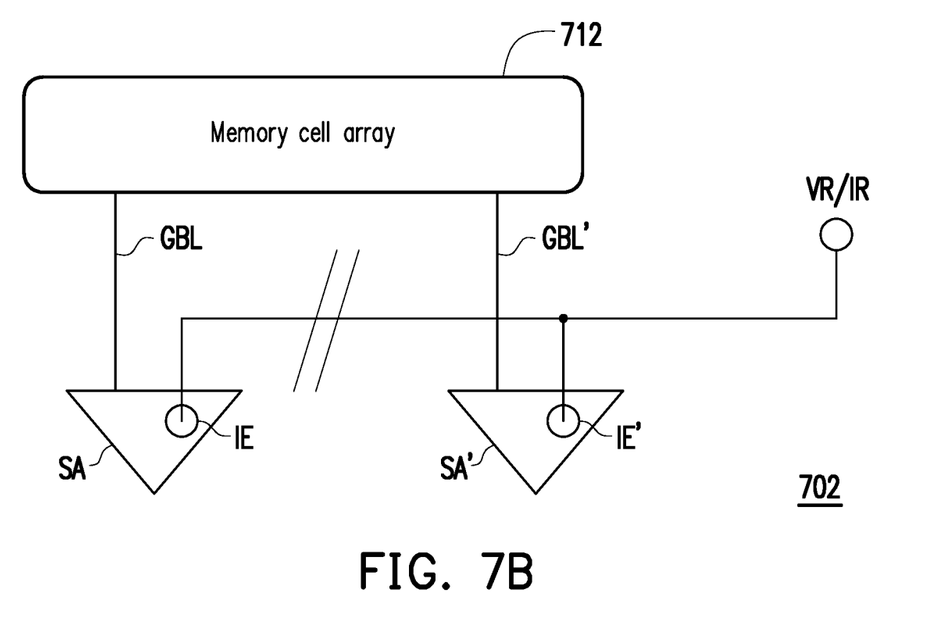

Please refer to FIG. 7A and FIG. 7B. FIG. 7A and FIG. 7B are schematic diagrams of multiple implementations of a data reading mode of a memory according to an embodiment of the disclosure. In FIG. 7A, a memory 701 includes a selected memory cell block 711 and a sense amplifying device 721. In the data reading mode, a memory cell SMC is the selected memory cell and sends the readout signal RS on the global bit line GBL. One terminal of the sense amplifier SA receives the readout signal RS, and the other terminal receives the reference signal combined from a threshold signal ITH and the leakage current information ILD. In the embodiment, the readout signal RS, the threshold signal ITH, and the leakage current information ILD are all current signals. The leakage current information ILD may be configured to offset errors of the readout signal RS caused by the leakage current, which can effectively improve the accuracy of the readout data DOUT.

In FIG. 7B, a memory 702 includes a memory cell array 712 and multiple sense amplifiers SA to SA'. The memory cell array 712 has multiple memory cell blocks, which are respectively coupled to multiple global bit lines GBL to GBL'. In the data reading mode, the sense amplifiers SA to SA' commonly receive a reference signal in addition to readout signals respectively generated by the global bit lines GBL to GBL'. In the embodiment, the reference signal may be a current reference signal IR or a voltage reference signal VR.

When the reference signal is the current reference signal IR, current mirror circuits may be disposed at input terminals IE to IE' of the sense amplifier SA to SA'. The current mirror circuits of the input terminals IE to IE' may respectively have different mirror ratios. The mirror ratios are respectively equivalent to multiple weight values and respectively correspond to multiple leakage current information on the global bit lines GBL to GBL'. The leakage current information may be generated in the leakage current detection mode.

When the reference signal is the voltage reference signal IR, devices that can adjust input impedances are disposed at the input terminals IE to IE' of the sense amplifier SA to SA', such as setting adjustable loads or adjusting sizes of transistors at the input terminals IE to IE' of the sense amplifiers SA to SA', so as to provide multiple weight values corresponding to multiple leakage current information on the global bit lines GBL to GBL'. The leakage current information may also be generated in the leakage current detection mode.

Figure 8:
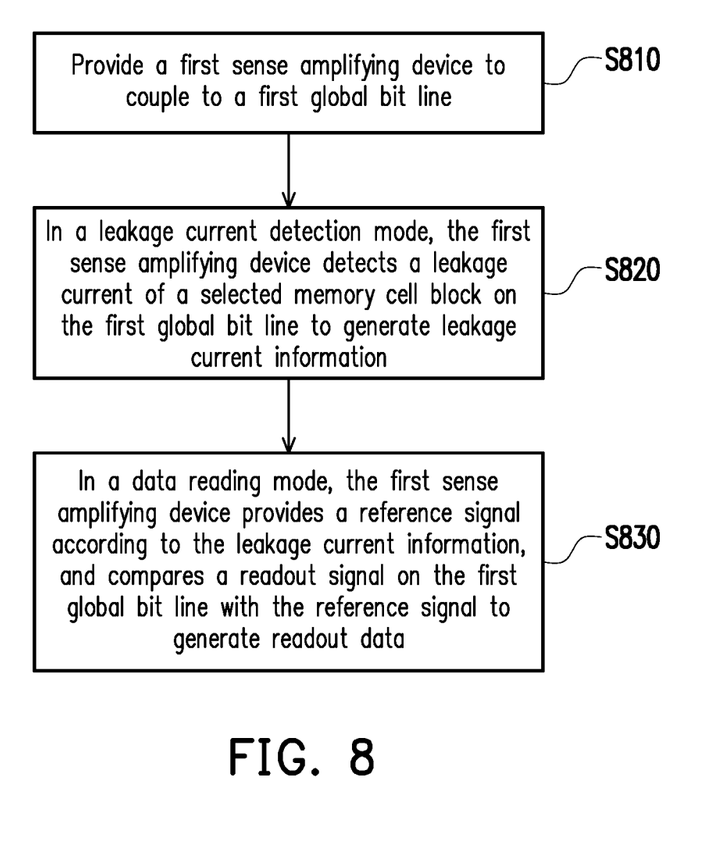
FIG. 8 is a flowchart of a reading operation of a memory according to an embodiment of the disclosure.

Please refer to FIG. 8 below. FIG. 8 is a flowchart of a reading operation of a memory according to an embodiment of the disclosure. In Step S810, the first sense amplifying device is provided to couple to the first global bit line. In Step S820, in the leakage current detection mode, the first sense amplifying device detects the leakage current of the selected memory cell block on the first global bit line to generate the leakage current information. Next, in Step S830, in the data reading mode, the first sense amplifying device provides the reference signal according to the leakage current information, and compares the readout signal on the first global bit line with the reference signal to generate the readout data.

The implementation details of the steps have been described in detail in the foregoing embodiment and will not be repeated.

In summary, the memory of the disclosure detects the leakage current information on the global bit line through the leakage current detection mode in the reading operation, and compensates for the leakage current according to the leakage current information in the data reading mode, which can effectively ensure the accuracy of the readout data.

What is claimed is:

1. A memory, comprising:
    a selected memory cell block, coupled to a first global bit line; and
    a first sense amplifying device, coupled to the first global bit line and configured to:
        in a leakage current detection mode, detect a leakage current of the selected memory cell block on the first global bit line to generate leakage current information, wherein word lines corresponding to the selected memory cell block are all disabled;
        in a data reading mode, provide a reference signal according to the leakage current information, and compare a readout signal on the first global bit line with the reference signal to generate readout data,
    wherein the leakage current detection mode happens before the data reading mode.

2. The memory according to claim 1, wherein in the data reading mode, a selected word line among the word lines is enabled, and at least one unselected word line among the word lines is disabled.

3. The memory according to claim 1, wherein the first sense amplifying device comprises:
    a first sense amplifier, having a first input terminal coupled to the first global bit line; and
    a ratio controller, coupled to a second input terminal of the first sense amplifier, the ratio controller receiving a setting signal, and adjusting the setting signal according to a setting ratio to generate a leakage current replica signal,
    wherein in the leakage current detection mode, the first sense amplifier compares a leakage current on the first global bit line and the leakage current replica signal to generate a comparison result, and the ratio controller adjusts the setting ratio according to the comparison result,
    when the comparison result changes from a first logic level to a second logic level, the leakage current replica signal is equal to the leakage current information.

4. The memory according to claim 3, wherein the setting signal, the leakage current replica signal, and the reference signal are all current signals.

5. The memory according to claim 4, further comprising:
    a second sense amplifier, coupled to a second global bit line; and
    a current mirror, coupled between the first sense amplifier and the second sense amplifier, in the leakage current detection mode, the current mirror mirroring the leakage current replica signal to generate a mirrored leakage current replica signal sent to the second sense amplifier.

6. The memory according to claim 3, further comprising:
    a current mirror, disposed on an input terminal of the first sense amplifier, and in the data reading mode, the current mirror mirroring the setting signal according to the leakage current information to generate the reference signal, wherein the leakage current information is a current signal.

7. The memory according to claim 3, wherein the reference signal is a voltage signal, and in the data reading mode, the first sense amplifier adjusts an impedance at an input terminal to generate the reference signal according to the leakage current information.

8. The memory according to claim 3, wherein in the data reading mode, the first sense amplifying device combines the leakage current information and a preset threshold signal to generate the reference signal.

9. A reading method of a memory, comprising:
    providing a first sense amplifying device to couple to a first global bit line;
    in a leakage current detection mode, disabling all word lines corresponding to a selected memory cell block, and detecting, by the first sense amplifying device, a leakage current of the selected memory cell block on the first global bit line to generate leakage current information; and
    in a data reading mode, providing, by the first sense amplifying device, a reference signal according to the leakage current information, and comparing a readout signal on the first global bit line with the reference signal to generate readout data,
    wherein the leakage current detection mode happens before the data reading mode.

10. The reading method of the memory according to claim 9, further comprising:
    in the data reading mode, enabling a selected word line among the word lines, and disabling at least one unselected word line among the word lines.

11. The reading method of the memory according to claim 9, wherein the step of generating the leakage current information comprises:
    coupling a first input terminal of a first sense amplifier to the first global bit line;
    providing a ratio controller to couple to a second input terminal of the first sense amplifier;

receiving, by the ratio controller, a setting signal, and adjusting the setting signal according to a setting ratio to generate a leakage current replica signal;

in the leakage current detection mode, comparing, by the first sense amplifier, a leakage current on the first global bit line and the leakage current replica signal to generate a comparison result, and adjusting, by the ratio controller, the setting ratio according to the comparison result; and when the comparison result changes from a first logic level to a second logic level, equating the leakage current replica signal to the leakage current information.

12. The reading method of the memory according to claim 11, wherein the setting signal, the leakage current replica signal, and the reference signal are all current signals.

13. The reading method of the memory according to claim 12, further comprising:

coupling a current mirror between the first sense amplifier and a second sense amplifier; and generating, by the current mirror, a mirrored leakage current replica signal sent to the second sense amplifier according to a mirror ratio and the leakage current information.

14. The reading method of the memory according to claim 11, wherein the first sense amplifier converts a leakage current on the first global bit line into a first voltage signal, and the reference signal into a second voltage signal.

15. The reading method of the memory according to claim 14, further comprising:

in the data reading mode, adjusting an impedance at an input terminal of the first sense amplifier to generate the reference signal according to the leakage current information.

16. The reading method of the memory according to claim 11, further comprising:

in the data reading mode, combining the leakage current information and a preset threshold signal to generate the reference signal.

\* \* \* \* \*